United States Patent [19]
Pollack

[11] Patent Number: 5,240,512
[45] Date of Patent: Aug. 31, 1993

[54] METHOD AND STRUCTURE FOR FORMING A TRENCH WITHIN A SEMICONDUCTOR LAYER OF MATERIAL

[75] Inventor: Gordon P. Pollack, Richardson, Tex.

[73] Assignee: Texas Instruments Incorporated, Dallas, Tex.

[21] Appl. No.: 857,041

[22] Filed: Mar. 24, 1992

Related U.S. Application Data

[62] Division of Ser. No. 531,997, Jun. 1, 1990, Pat. No. 5,120,675.

[51] Int. Cl.⁵ .................................... H01L 23/00
[52] U.S. Cl. ................................ 148/33.3; 437/978
[58] Field of Search ............. 148/33.2, 33.3, DIG. 50; 437/67, 69, 70, 72, 83, 978; 156/643, 649

[56] References Cited

U.S. PATENT DOCUMENTS

| | | | |
|---|---|---|---|
| H204 | 2/1987 | Oh et al. ........................... | 156/648 |
| 4,462,846 | 7/1984 | Varshney ......................... | 148/33.2 |
| 4,750,971 | 6/1988 | Maas et al. ...................... | 156/643 |
| 5,004,703 | 3/1991 | Zdebel et al. .................... | 437/67 |
| 5,096,848 | 3/1992 | Kawamura ....................... | 437/67 |

FOREIGN PATENT DOCUMENTS

| | | |
|---|---|---|
| 0104765 | 4/1984 | European Pat. Off. . |
| 60-149149 | 8/1985 | Japan . |
| 63-122239 | 5/1988 | Japan . |
| 64-67938 | 3/1989 | Japan . |

Primary Examiner—Olik Chaudhuri
Assistant Examiner—Ourmazd S. Ojan
Attorney, Agent, or Firm—Ira S. Matsil; James C. Kesterson; Richard L. Donaldson

[57] ABSTRACT

A method and structure for forming a trench within a semiconductor layer (12) of material is provided. A first mask structure comprising a third insulating layer (20) and a fourth insulating layer (22) is formed adjacent a semiconductor layer (12). Sidewall spacers comprising a first and second portion (30) and (32) are formed along the sidewall (25) of layers (20) and (22) and extending outwardly the refrom. A second mask structure comprising a field insulating region (36) is formed adjacent first sidewall spacer portions (30) and along semiconductor layer (12). The foot portions (34) of first sidewall spacer portions (30) are removed thereby defining an exposed area (38) between the first mask structure and second mask structure. A trench (40) may then be formed between the two mask structures and filled with dielectrical material in order to isolate a semiconductor mesa (42) from semiconductor regions (44a) and 44b).

11 Claims, 3 Drawing Sheets

METHOD AND STRUCTURE FOR FORMING A TRENCH WITHIN A SEMICONDUCTOR LAYER OF MATERIAL

The U.S. Government has a paid up license in this invention and rights in limited circumstances to require the patent owner to license others on reasonable terms as provided for by the terms of Contract Number DNA001-86C-0090 awarded by the Defense Nuclear Agency.

This is a division, of application Ser. No. 07/531,997, filed Jun. 1, 1990, now U.S. Pat. No. 5,120,675.

TECHNICAL FIELD OF THE INVENTION

This invention relates in general to semiconductor devices and more particularly to a method and structure for forming a trench within a semiconductor layer of material.

BACKGROUND OF THE INVENTION

In contemporary semiconductor technology, planar devices are constructed to include trenches which may be used in order to isolate active devices formed within the semiconductor. For example, these trenches may be used in bulk CMOS processes or in silicon-on-insulator (SOI) topologies. Under current technology, conventional trench isolation is performed by photolithography. As a result, the width of the trench formed by the photolithographic process may be no shorter than the resolution of the photolithographic device. For example, in contemporary one micron technology, the width of a trench is necessarily limited to being no shorter than one micron.

The aforementioned limitations associated with photolithography impose particular constraints on SO1 MOSFETs. Electrical isolation of SO1 MOSFETs is typically achieved through removal or trenching of the silicon-on-insulator layer in the field region. Active device structures are then fabricated in the resulting silicon mesas by standard integrated circuit fabrication methods. While high packing density and total dielectric isolation is achieved by this technique, mesa isolation suffers from poor device topography and difficulty in suppressing the parasitic mesa sidewall transistor.

An additional approach, which allows optimum packing density, planar device topography and high radiation tolerance is to isolate individual device structures by dielectrically filled trenches. Conventional trench isolation of bulk MOSFETs is performed by photolithographically defining the trench opening, etching with an anisotropic silicon etch and refilling the trench with a suitable dielectric material. The trench refill process is normally done in two steps: (1) deposition of a conformal layer of a thickness greater than one-half the trench width in order to completely refill the trench; and (2) anisotropic etchback of the deposited layer to remove the deposited material from non-refilled areas. However, this refill and etchback technique becomes very difficult to control when applied to thin film (0.3 microns) SO1 MOSFETs. The difficulty arises because the aspect ratio, that is the ratio of the trench depth to the trench width, may no longer be optimized. In particular, this aspect ratio is preferably on the order of 10 to 1. Thus for a 0.3 micron deep trench, a trench width on the order of 0.03 microns is desirable; however, under standard one micron photolithography, there exists no method for forming a trench having a width under one micron. As a result, standard photolithographic processes may not be used to create trenches for thin film SOI applications.

Therefore, a need has arisen for a method and structure for forming a trench within a semiconductor layer of material without having to rely solely on photolithographic processes in order to define the width of the trench formed.

SUMMARY OF THE INVENTION

In accordance with the present invention, a method and structure for forming a trench within a semiconductor layer of material are provided which substantially eliminate and prevent disadvantages and problems associated with prior trench formation structures and techniques.

The method of the present invention for forming a trench within a semiconductor layer of material comprises forming a first mask structure adjacent the semiconductor layer and having a sidewall. A sidewall spacer is formed adjacent the sidewall of the first mask structure. A second mask structure is formed adjacent the semiconductor layer and adjacent the sidewall spacer opposite from the first mask structure sidewall. A portion of the sidewall spacer is selectively removed and the semiconductor layer is etched such that the layer is protected from the etch by the first mask structure, the selectively removed sidewall spacer and the second mask structure.

An additional aspect of the present invention includes forming the sidewall spacer having a first portion along the sidewall and a foot portion extending adjacent the semiconductor layer. The selective removal of a portion of the sidewall spacer may then comprise removing the foot portion of the spacer.

The present invention provides numerous technical advantages over prior techniques for forming narrow width trenches within a semiconductor layer. A trench formed and refilled under the present invention provides the advantage of a planar device topography. Further, an active region isolated by a trench formed by the present invention has been determined to provide the technical advantage of a low leakage current. The present invention provides much narrower trenches than standard photolithographic processes. Additionally, the width of a trench formed in accordance with the present invention may accurately be controlled.

BRIEF DESCRIPTION OF THE DRAWINGS

For a more complete understanding of the present invention and the advantages thereof, reference is now made to the following description taken in conjunction with the accompany drawings in which.

BRIEF DESCRIPTION OF THE INVENTION

Figure 1:
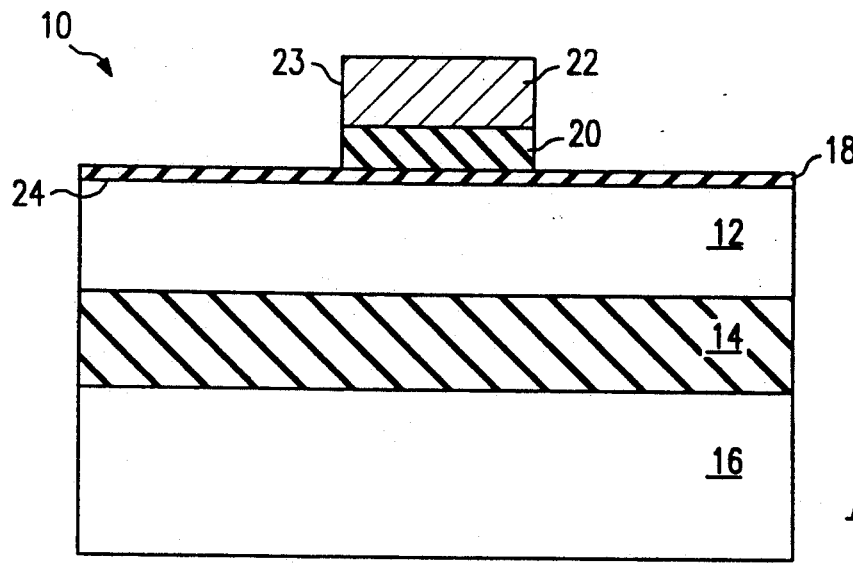
FIG. 1 illustrates a cross-sectional view of a semiconductor layer having a first mask structure constructed thereon.

FIG. 1 illustrates a cross-sectional view of a silicon-on-insulator (SO1) structure denoted generally at 10. SOI structure 10 includes a semiconductor layer 12 which typically comprises silicon. Semiconductor layer 12 overlies an insulating layer 14 which is typically known as a buried oxide. Insulating layer 14 overlies a semiconductor substrate 16. An insulating layer 18 is formed over semiconductor layer 12. Typically insulating layer 18 is a grown pad oxide on the order of 350 angstroms in thickness. A third insulating layer 20 and a fourth insulating layer 22 are formed adjacent second insulating layer 18. In particular, third insulating layer 20 may comprise silicon nitride deposited by a low pressure chemical vapor deposition (LPCVD) at a thickness of 1400 angstroms. Fourth insulating layer 22 may comprise a deposited layer of TEOS oxide which is deposited by an LPCVD process at a thickness on the order of 3,000 angstroms.

The combination of third and fourth insulating layers 20 and 22 are patterned by conventional photolithographic processes. Thereafter, an anisotropic plasma etch is utilized in order to remove selective portions of second, third and fourth insulating layers 18, 20 and 22, such that the surface 24 of semiconductor layer 12 is exposed. Further, the etch leaves a block-like structure over semiconductor layer 12 in order to form part of a mask for subsequent processing steps. The remaining block-like structure includes sidewalls 25. The portions of second insulating layer 18 removed laterally from this partial mask structure are then regrown at surface 24 of semiconductor layer 12.

Figure 2:
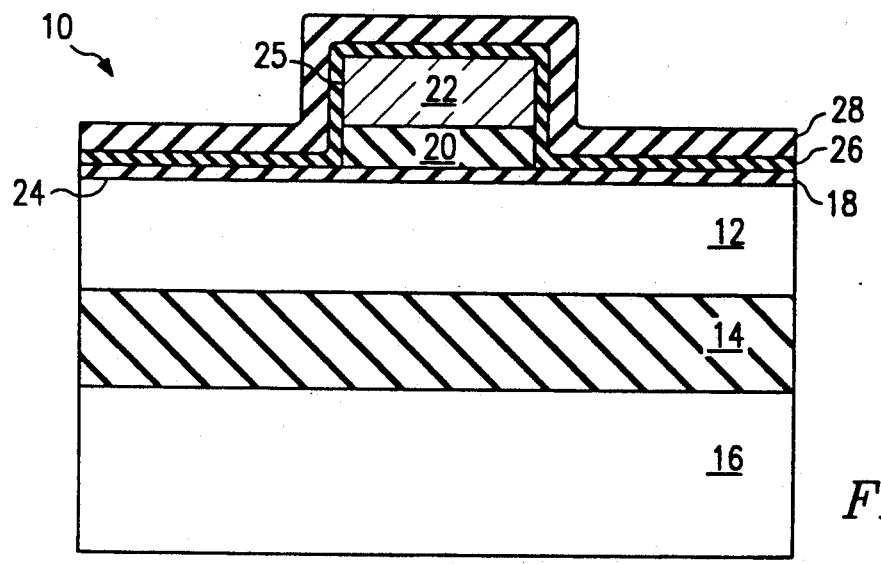
FIG. 2 illustrates a cross-sectional view of the mask structure of FIG. 1 having a first and second insulating layer formed thereover.

FIG. 2 illustrates SOI structure 10 having a fifth insulating layer 26 and a sixth insulating layer 28 formed thereover. Fifth insulating layer 26 is an LPCVD silicon nitride layer on the order of 1,000 angstroms in thickness. Sixth layer 28 is an LPCVD TEOS oxide layer on the order of 3,000 angstroms in thickness. The resultant structure in FIG. 2 is subjected to an anisotropic plasma etch thereby diminishing fifth and sixth insulating layers 26 and 28.

Figure 3:
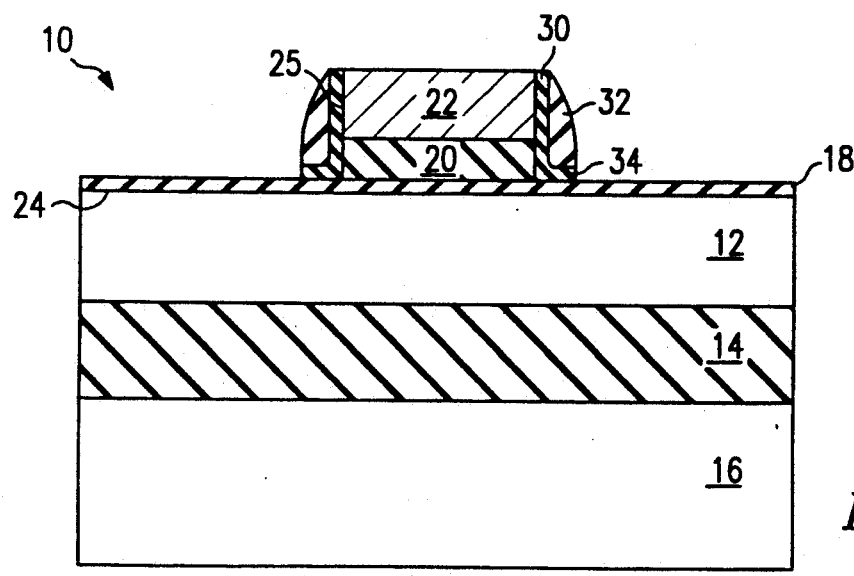
FIG. 3 illustrates a cross-sectional view of the mask structure of FIG. 2 having a second mask structure adjacent the first mask structure and the semiconductor layer.

FIG. 3 illustrates SOI structure 10 after the aforementioned anisotropic plasma etch. The anisotropic etch reduces fifth and sixth insulating layers 26 and 28 thereby resulting in a first sidewall spacer portion 30 and a second sidewall spacer portion 32. First sidewall spacer portion of 30 runs along sidewalls 25 of third and fourth insulating layers 20 and 22, and extends outwardly along second insulating layer 18 adjacent semiconductor layer 12. Sidewall spacer portions 30 and 32 together comprise a sidewall spacer along sidewalls 25. Further, the combination of the block-like structure comprising third and fourth layers 20 and 22 along with these sidewall spacers may be used as a mask structure for subsequent processing steps of semiconductor layer 12.

The extension of first sidewall spacer portion 30 outwardly from third insulating layer 20 is referred to as a "foot" portion 34. From FIGS. 2 and 3, it may be appreciated that the distance of lateral extension of foot portion 34 is determined by the thickness of sixth insulating layer 28 as shown in FIG. 2. In particular, the vertical portions of sixth insulating layer 28 parallel to sidewalls 25 protect fifth insulating layer 26 during the anisotropic etch. As a result, fifth insulating layer 26 is selectively etched leaving the foot portion 34 shown in FIG. 3.

Figure 4:
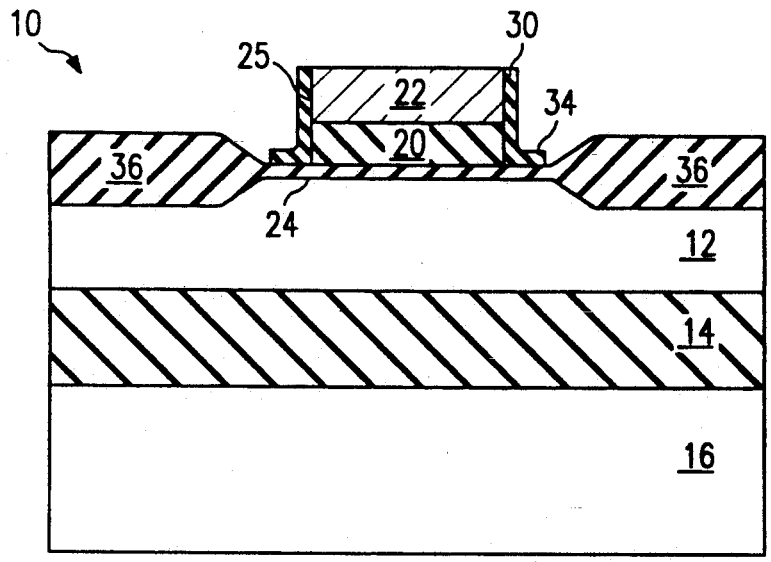
FIG. 4 illustrates a cross-sectional view of the mask structures shown in FIG. 3 following selective removal from the second mask structure and growth of the field insulating region.

FIG. 4 illustrates SOI structure 10 following additional processing steps. SO1 structure 10 is exposed to a 900° C. steam in order to oxidize the structure. As a result, second insulating layer 18 increases in size to a preferred thickness on the order of 3500 angstroms thereby forming field insulating regions 36. A plasma nitride etch is performed in order to remove second sidewall spacer portions 32, thereby exposing first sidewall spacer portions 30. After removal of second sidewall spacer portion 32, an anisotropic nitride/oxide etch is performed in order to remove foot portions 34.

Figure 5:
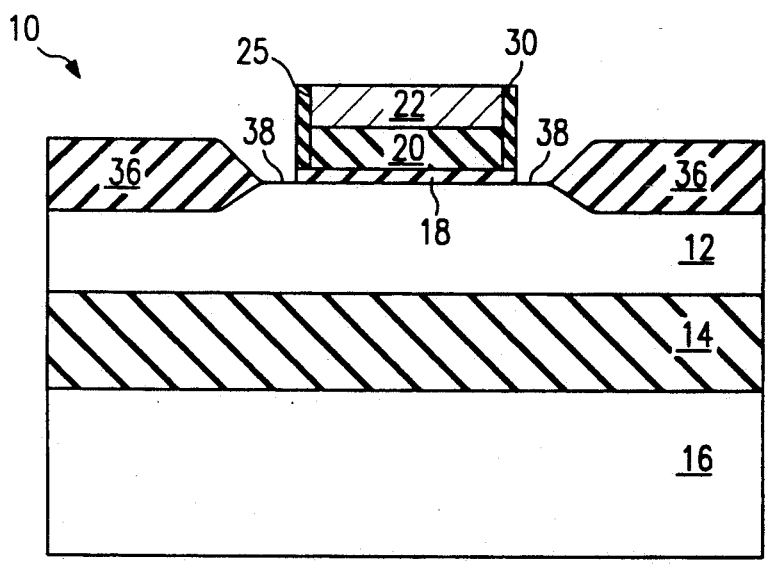
FIG. 5 illustrates the mask structures of FIG. 4 after further selective removal from the second mask structure and an underlying insulating layer.

FIG. 5 illustrates SOI structure 10 after the foot removal step discussed immediately above. In addition to removal of foot portions 34, the anisotropic etch causes a reduction in the vertical height of fourth insulating layer 22, first sidewall spacer portions 30 and field insulating regions 36. Further, the removal process defines exposed areas 38 of semiconductor layer 12 between field insulating regions 36 and the combination of the remaining portions of second insulating layer 18 and first sidewall spacer portions 30. Field insulating regions 36 may be used as an additional mask structure to protect semiconductor layer 12 during subsequent processing steps.

Figure 6:
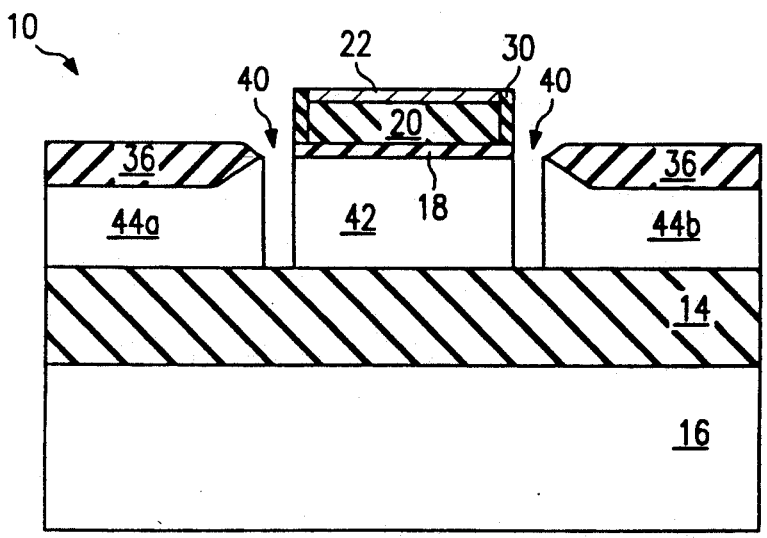
FIG. 6 illustrates a cross-sectional view of the semiconductor layer having trenches formed therein.

FIG. 6 illustrates SOI structure 10 having trenches formed therein. Structure 10 illustrated in FIG. 5 is subjected to an etching process, which in the preferred embodiment is a reactive ion etch (RIE). The RIE process is an anisotropic etch extending from exposed areas 38 down to first insulating layer 14. Accordingly, trenches 40 are formed within semiconductor layer 12 as shown in FIG. 6. The RIE anisotropic etch will also reduce fourth insulating layer 22, first sidewall spacer portions 30 and field insulating regions 36 to a lesser extent than the semiconductor material of semiconductor layer 12. The formation of trenches 40 defines a semiconductor mesa 42 between additional semiconductor regions 44a and 44b. Semiconductor mesa 42 may thereafter be utilized in order to construct active devices therein, while semiconductor regions 44a and 44b may be used to isolate semiconductor mesa 42, or may alternatively be used in order to form active semiconductor devices.

It may be appreciated, from the example of FIGS. 4, 5 and 6, that the lateral extent of foot regions 34 define the ultimate width of trenches 40 formed within semiconductor layer 12. As described above, the lateral extent of foot portions 34 is defined by the thickness of sixth insulating region 28 shown in FIG. 22. Accordingly, the particular width of a trench 40 may be selected by choosing a corresponding thickness for sixth insulating layer 28 when the same is deposited as described above. Consequently, the Width of a trench may be accurately controlled by the thickness of a material layer rather than relying on the accuracy of photolithographic masks as used in prior art fabrication techniques.

Figure 7:
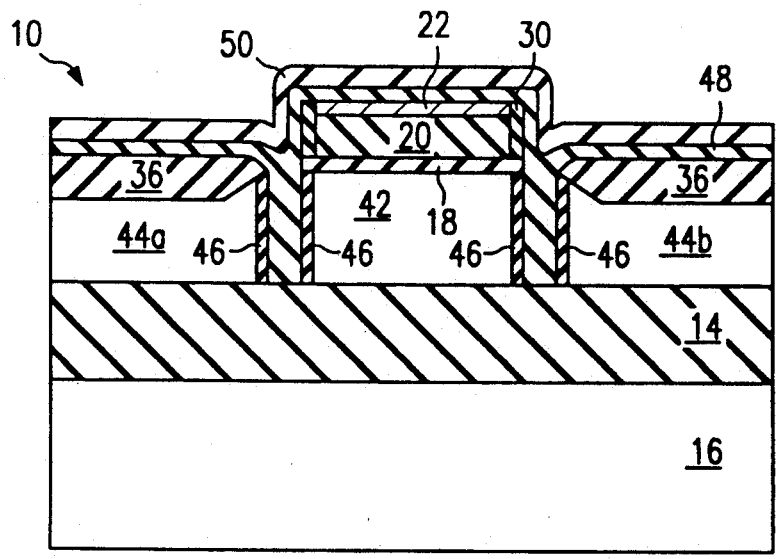
FIG. 7 illustrates a cross-sectional view of the semiconductor trenches of FIG. 6 having a filling layer added thereto.

FIG. 7 illustrates SOI structure 10 after trenches 40 illustrated in FIG. 6 have been filled with an insulating material. A trench insulating or dielectric layer 46 is formed along the sidewalls of semiconductor mesa 42 and semiconductor regions 44a and 44b. Typically, trench insulating layer 46 is an oxide grown in a 1,000° C. oxygen ambient to a thickness on the order of 200 angstroms. A seventh insulating layer 48 is formed along the surface of SOI structure 10. Accordingly, seventh insulating 48 overlies field insulating regions 36, fourth insulating layer 22 and first sidewall spacer Portions 30, while extending within trenches 40 shown in FIG. 6. Seventh insulating layer 48 in the preferred embodiment is an LPCVD layer of nitride on the order of 1,000 angstroms in thickness. An eighth insulating layer 50 is formed overlying seventh insulating layer 48. Eighth insulating layer 50, in the preferred embodiment, is an LPCVD layer of TEOS oxide formed of a thickness on the order of 1,000 angstroms. Following the deposition of seventh and eighth insulating layers 48 and 50, SOI structure 10 of FIG. 7 is anisotropically etched to selectively remove portions of seventh and eighth insulating layers 48 and 50.

Figure 8:
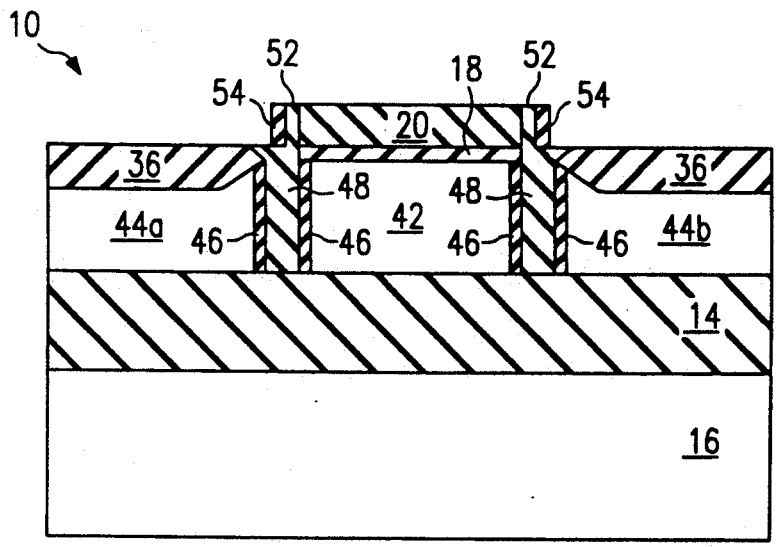
FIG. 8 illustrates a cross-sectional view of the trenches of the present invention following etchback of the filling layer shown in FIG. 7.

FIG. 8 illustrates SOI structure 10 after the anisotropic etch of seventh and eighth insulating layers 48 and 50. The anisotropic etch removes seventh and eighth insulating layers 48 and 50 overlying third insulating layer 20 and field insulating regions 36. As a result, there remains two vertical insulating portions 52 and 54 over each filled trench 40. Vertical insulating portions 52 and 54 protect the insulating material within trench 40 during subsequent planarizing processing steps. In particular, SOI structure 10 is subjected to a hot phosphoric acid which removes only nitride materials. As a result, fourth insulating layer 22 and vertical insulating portions 52 are anisotropically removed from SOI structure 10. Vertical insulating portion 54 protects the nitride filling of trenches 40 during this phosphoric removal process. Thereafter, vertical insulating portions 54 may be selectively removed, thereby rendering the planar device illustrated in FIG. 9.

Figure 9:
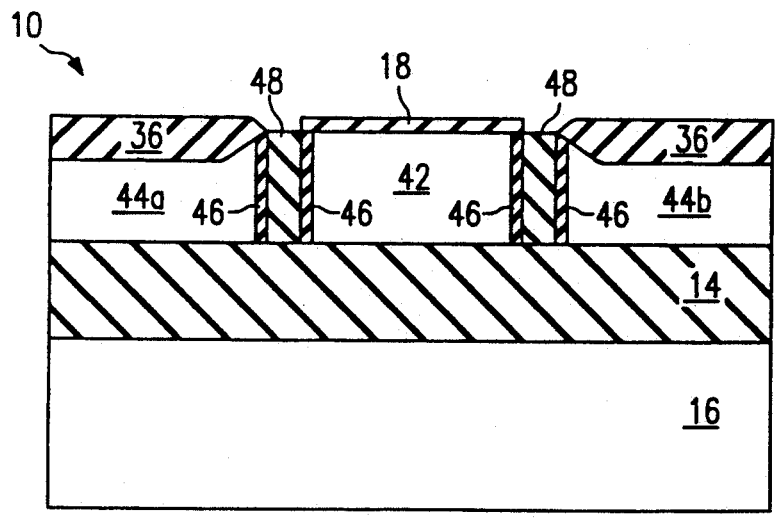
FIG. 9 illustrates a cross-sectional view of a planar device constructed in accordance with the present invention.

FIG. 9 illustrates a cross-sectional view of SOI structure 10 of the present invention. As may be appreciated from the perspective of FIG. 9, SOI structure 10 results in a planar topology having numerous technical advantages associated therewith. In particular, as known in the art, proper planar topologies provide for accurate etchback and formation of active devices within the planar semiconductor materials. Further, the formation of narrow width trenches filled with dielectric or insulating material permits optimum packing density, planar device topologies and low leakage current between active devices formed within the semiconductor material and thus isolated by the trench fillings.

The above-description of the present invention has particular applicability to SOI semiconductor processes. However, it should be understood that the present invention need not be limited thereto, but may also be used in the formation of trenches within bulk CMOS processes or other alternative semiconductor fabrication techniques. Thus it should be noted, that while the present invention has been described in detail, various changes, substitutions and alternations may be made hereto without departing from the spirit and scope of the invention as defined by the appended claims.

What is claimed is:

1. A trench mask structure for forming a trench within a semiconductor layer, comprising:
   a first mask structure adjacent the semiconductor layer and having a sidewall;
   a sidewall spacer adjacent the sidewall of said first mask; and
   a second mask structure adjacent the semiconductor layer, adjacent said sidewall spacer and opposite from said first mask structure sidewall;
   wherein a portion of said sidewall spacer is removed such that a portion of the semiconductor layer to be etched is defined between said second mask structure and the remaining portion of said sidewall spacer.

2. The trench mask structure of claim 1 wherein said first mask structure comprises:
   a first insulating layer adjacent the semiconductor layer;
   a second insulating layer adjacent said first insulating layer and opposite the semiconductor layer; and
   a third insulating layer adjacent said second insulating layer and opposite said first insulating layer.

3. The trench mask structure of claim 2 wherein said first insulating layer comprises oxide, wherein said second insulating layer comprises nitride, and wherein said third insulating layer comprises TEOS.

4. The trench mask structure of claim 1 wherein said sidewall spacer comprises a sidewall spacer having a first portion along said sidewall and a foot portion extending adjacent the semiconductor layer.

5. The trench mask structure of claim 1 wherein said second mask structure comprises an oxide region.

6. The trench mask structure of claim 1 wherein the semiconductor layer comprises a semiconductor over insulator layer.

7. A trench mask structure for forming a trench within a semiconductor layer, comprising:
   a first mask structure adjacent the semiconductor layer and having a sidewall;
   a sidewall spacer adjacent said sidewall of said first mask structure, said sidewall spacer comprising a first portion along said sidewall and a foot portion extending adjacent the semiconductor layer; and
   a second mask structure adjacent the semiconductor layer, adjacent said sidewall spacer and opposite from said first mask structure sidewall;
   wherein a portion of said sidewall spacer is removed such that a portion of the semiconductor layer to be etched is defined between said second mask structure and the remaining portion of said sidewall spacer.

8. The trench mask structure of claim 7 wherein said first mask structure comprises:
   a first insulating layer adjacent the semiconductor layer;
   a second insulating layer adjacent said first insulating layer and opposite the semiconductor layer; and
   a third insulating layer adjacent said second insulating layer and opposite the first insulating layer.

9. The trench mask structure of claim 8 wherein said first insulating layer comprises oxide, wherein said second insulating layer comprises nitride, and wherein said third insulating layer comprises TEOS.

10. The trench mask structure of claim 7 wherein said sidewall spacer comprises:
    a first insulating layer comprising said first portion and said foot portion; and
    a second insulating layer adjacent said first insulating layer and opposite the semiconductor layer.

11. The trench mask structure of claim 7 wherein said second mask structure comprises an oxide region.

* * * * *